United States Patent

Hsu et al.

(10) Patent No.: US 7,855,575 B1
(45) Date of Patent: Dec. 21, 2010

(54) WIDE VOLTAGE RANGE LEVEL SHIFTER WITH SYMMETRICAL SWITCHING

(75) Inventors: Steven K. Hsu, Lake Oswego, OR (US);
Daniel I. Davis, Portland, OR (US);
Amit Agarwal, Hillsboro, OR (US);
Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/566,977

(22) Filed: Sep. 25, 2009

(51) Int. Cl.
*H03K 19/0175* (2006.01)

(52) U.S. Cl. .............................. 326/80; 326/63; 326/68; 326/81

(58) Field of Classification Search ...................... None
See application file for complete search history.

(56) References Cited

U.S. PATENT DOCUMENTS

| 5,680,064 | A | * | 10/1997 | Masaki et al. ................. 326/81 |
|---|---|---|---|---|
| 6,563,357 | B1 | | 5/2003 | Hsu et al. |
| 7,132,856 | B2 | | 11/2006 | Hsu et al. |
| 7,352,209 | B2 | | 4/2008 | Hsu et al. |
| 2004/0212021 | A1 | * | 10/2004 | Shimizu ...................... 257/375 |

* cited by examiner

*Primary Examiner*—Anh Q Tran
(74) *Attorney, Agent, or Firm*—Blakely, Sokoloff, Taylor & Zafman LLP

(57) ABSTRACT

Described herein is the method and apparatus for generating symmetrical level shifted signals by a symmetrical level shifter. The symmetrical level shifter comprises an edge detector operable to generate transition edge based pulses from an input signal based on a first power supply level; a voltage level shifter, coupled with the edge detector, operable to convert the transition edge based pulses based on the first power supply level to edge based pulses based on a second power supply level; and a divider circuit, coupled with the voltage level shifter, operable to generate an output signal from the edge based pulses based on the second power supply level.

20 Claims, 6 Drawing Sheets

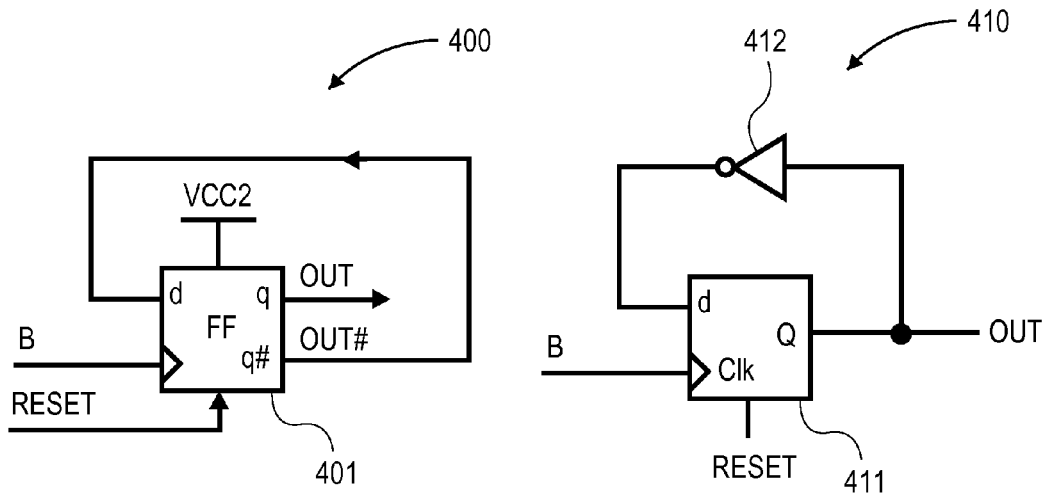
FIG. 4A  FIG. 4B
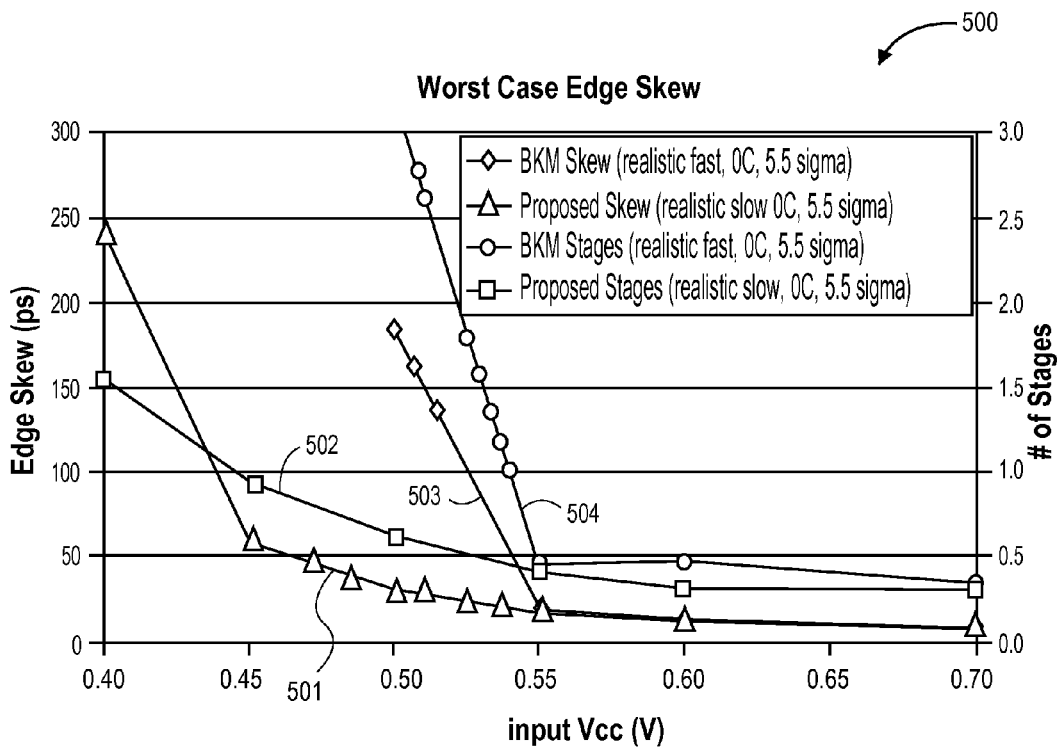
FIG. 5

WIDE VOLTAGE RANGE LEVEL SHIFTER WITH SYMMETRICAL SWITCHING

FIELD OF THE INVENTION

Embodiments of the invention relate generally to the field of signal level-shifting and more particularly to methods and apparatus for generating a level shifted output from one power supply level to another power supply level such that the level shifter provides a wide voltage range for level shifting and symmetrical switching.

BACKGROUND

Modern microprocessors and system-on-a-chip (SoC) designs operate on multiple power supply levels. For example, input-output circuits (I/Os) generally operate at higher power supply levels than the core of the processor because I/Os may require higher voltage level swings to transfer data across long transmission lines. The core of the processor generally operates at a lower power supply level to save power dissipation where most of the circuits reside. Similarly, Phase Locked Loops (PLLs) require quite power supply levels that are shielded from the noise generated on the power supply levels from the core of the processor. In multi-core processors each core may operate on a different power supply domain resulting in a complex system of multiple power supply domains between cores and within cores.

For circuits on one power supply domain to communicate with a circuit on another power supply domain, interface circuits are used. These interface circuits are called level shifters. Typically, level shifters have asymmetric switching delays resulting in a different duty cycle at the output as compared to the input of the level shifter. This asymmetric switching delay results from two distinct paths for each rising and falling input signal transition.

FIG. 3A refers to one such level shifter 300 when used as a standalone level shifter. When an input signal A, which operates between power supply level Vcc1 and ground, switches from ground to Vcc1, the NMOS transistor 301 turns on and discharges node D# by overcoming the pull-up strength of PMOS transistors 303 and 302. Consequently, the PMOS transistors 304 and 305 pull up node D to power supply level Vcc2 because the NMOS transistor 307 is off due to signal A#. This causes the output node B to transition from ground to Vcc2 via inverter 308. When the input signal A transitions from Vcc1 to ground then the NMOS transistor 307 turns on and discharges node D by overcoming the PMOS transistors 304 and 305. Consequently, the PMOS transistor 303 and 302 pulls up node D# since node A is at ground. This causes the output node B to transition from Vcc2 to ground via the inverter 308. Since the level shifter has two distinct paths for each rising and falling transitions of the input signal A, the switching delays through the level shifter circuit become asymmetric.

For critical signals such as clock signals, asymmetrical switching, which is characteristic of a level shifter, can cause duty cycle variations in the clock signal resulting in timing contingencies. For example, an asymmetric clock signal from a typical level shifter may result in setup and hold time violations (min/max delays). These timing contingencies may reduce the overall operating frequency of the system.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 4A illustrates a toggle flip-flop used in the symmetrical switching level shifter, according to one embodiment of the invention.

FIG. 4B illustrates a toggle flip-flop according to another embodiment of the invention.

FIG. 5 illustrates a graph showing improvement in skew via the symmetrical switching level shifter by comparing the skew via a traditional level shifter, according to one embodiment of the invention.

DETAILED DESCRIPTION

Embodiments of the invention discuss a method and apparatus of generating symmetrical switching output signals from a level shifter. These symmetrical switching output signals from the symmetrical switching level shifter, in one embodiment, have a 50% duty cycle and are relatively immune from process, voltage, and temperature variations when compared with transitional level shifters. The symmetrical switching output signals from the symmetrical switching level shifter, in one embodiment, are also relatively immune from voltage differences between power supply levels Vcc1 and Vcc2 when compared with transitional level shifters.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Figure 1:
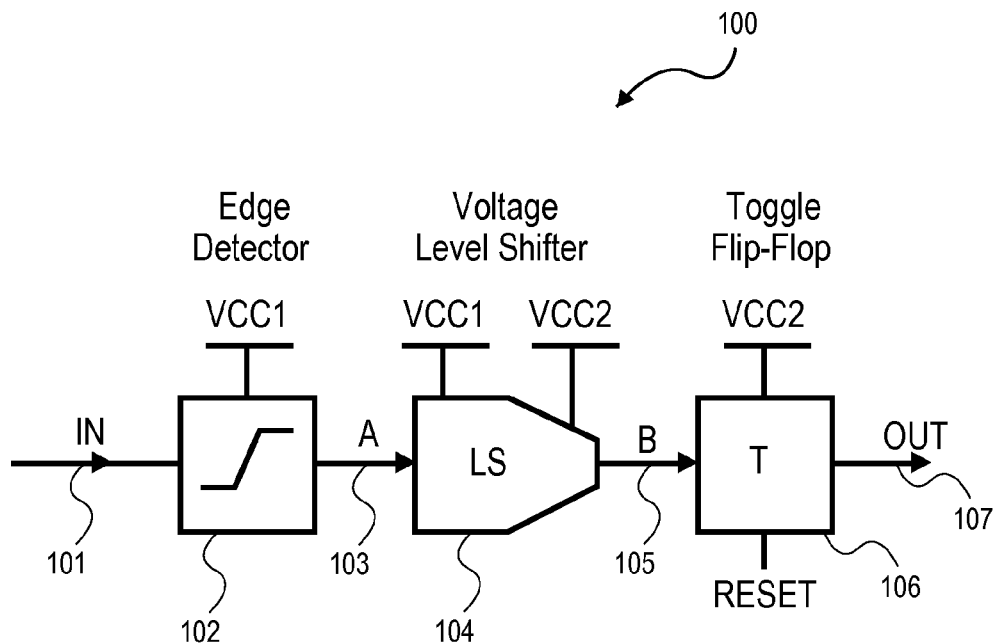
FIG. 1 illustrates a symmetrical switching level shifter, according to one embodiment of the invention.
Figure 3A:
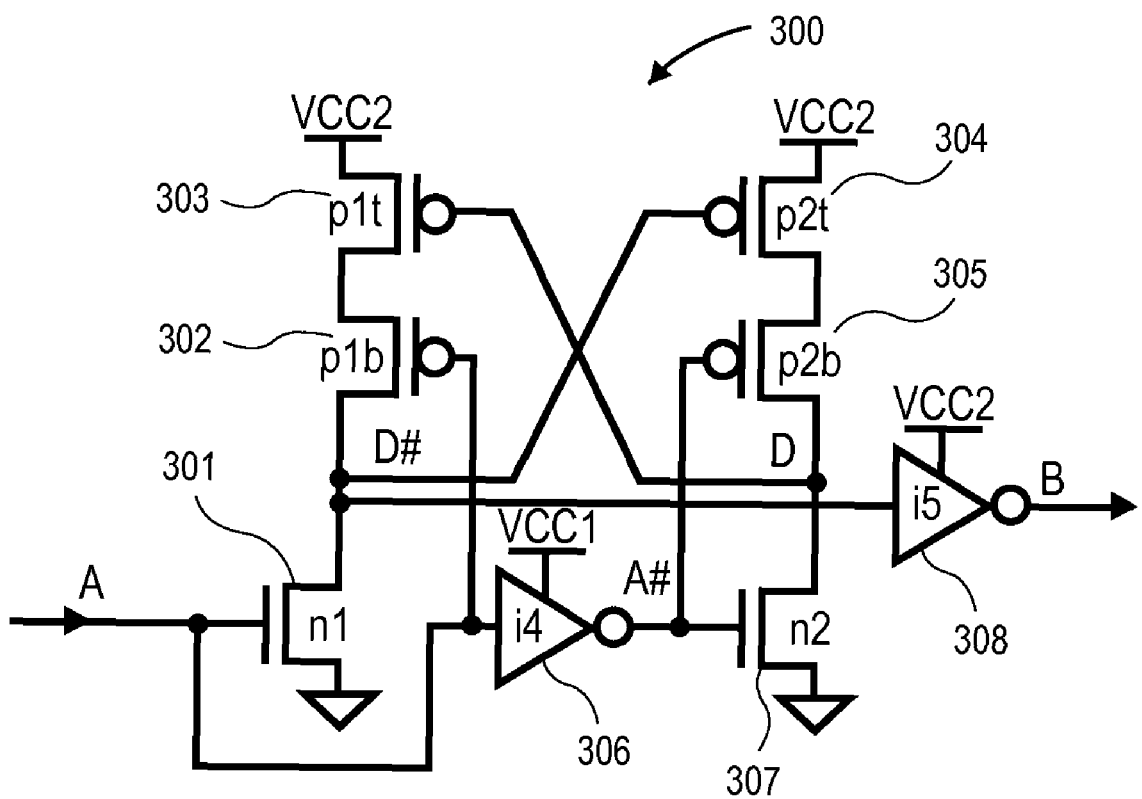
FIG. 3A illustrates a cascode voltage switch logic based level shifter (CVSL) as implemented in the symmetrical level shifter, according to one embodiment of the invention.

A level shifter converts an incoming input signal operating on a first power supply level Vcc1 to an output signal on a second power supply level Vcc2. During the conversion, the high and low transitions of the output signal depend on the device strengths of the level shifter. The effect of the device strengths in one specific process, voltage, and temperature case may achieve a symmetrical output signal. However, when temperature changes or voltage level fluctuates, or process varies in characteristics over semiconductor dies or within die, then the output signal characteristics change. This change results in unpredictable skew in the output signal relative to the input signal. One such level shifter is shown in FIG. 3A which is discussed in the background section and later below in reference to the symmetrical level shifter. Such a level shifter (i.e. level shifter of FIG. 3A) when incorporated with an edge detector and a toggle flip-flop, in one embodiment as shown in FIG. 1, removes the undesired effect of the level-shifter device size on the output signal resulting in symmetrical switching at the output of the level shifter. Moreover, the output of the level shifter becomes practically immune to process variations.

Referring to FIG. 1, a symmetrical switching level shifter 100 is shown according to one embodiment of the invention. An input signal 101 operating on power supply level Vcc1, in one embodiment, is received by an edge detector 102. The edge detector 102 detects the transition edges of the input signal 101 and generates transition edge based pulses 103. In one embodiment, the transition edge based pulses are based on both the rising and/or falling edges of the input signal 101. These transition edge based pulses 103 are on the same power supply level as the input signal 101. The transition edge based pulses are then, in one embodiment, input to the level shifter 104.

Figure 3B:
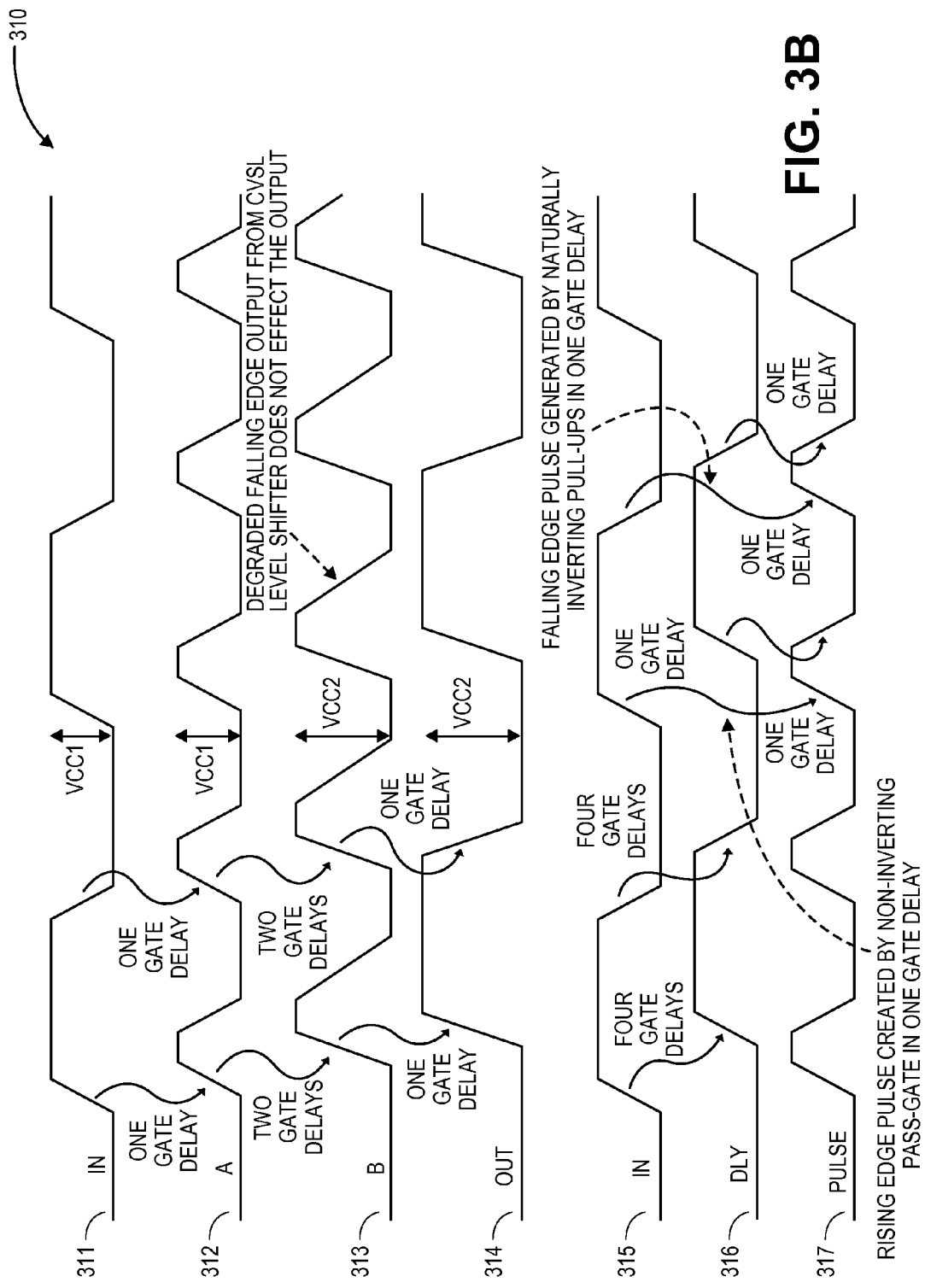
FIG. 3B illustrates a timing diagram showing the operation of the symmetrical switching level shifter and the edge detector, according to one embodiment of the invention.

The frequency of the transition edge based pulses, in one embodiment, is twice the frequency of the input signal because the pulses are based on the rising and the falling transitions of the input signal as shown by waveforms 311 and 312 of FIG. 3B.

Referring back to FIG. 1, the level shifter 104, in one embodiment, is a traditional voltage level shifter. As discussed above, the level shifter 104 converts its input signal, the transition edge based pulses, from Vcc1 to Vcc2 power supply level as shown by signal 313 of FIG. 3B. Having the edge detector 102 precede the level-shifter 104, in one embodiment, moves the optimization effort of the output signal 105 from the level shifter 104 to the edge detector 102.

Referring back to FIG. 1, the output of the level shifter 105 is input to a toggle flip-flop 106, according to one embodiment of the invention. In one embodiment, the toggle flip-flop 106 is a divider circuit. The divider circuit, in one embodiment, is divides input to the divider circuit by two. The toggle flip-flop 106 operates on the second power supply level Vcc2. In one embodiment, the toggle flip-flop 106 is a resettable toggle flip-flop. The output 107 of the toggle flip-flop 106 has the same frequency as the input signal 101. In one embodiment, the toggle flip-flop 106 generates a 50% duty cycle output. This means that a degraded output pulse 105 from the level-shifter 104 as shown by 313 of FIG. 3B does not impact the output 314 of the toggle flip-flop 106. In other words, differences in the rising and falling edge rates of the output pulse 105 caused by process, temperature, or voltage variation do not impact the output 314 of the toggle flip-flop 106, according to one embodiment of the invention.

Figure 2A:
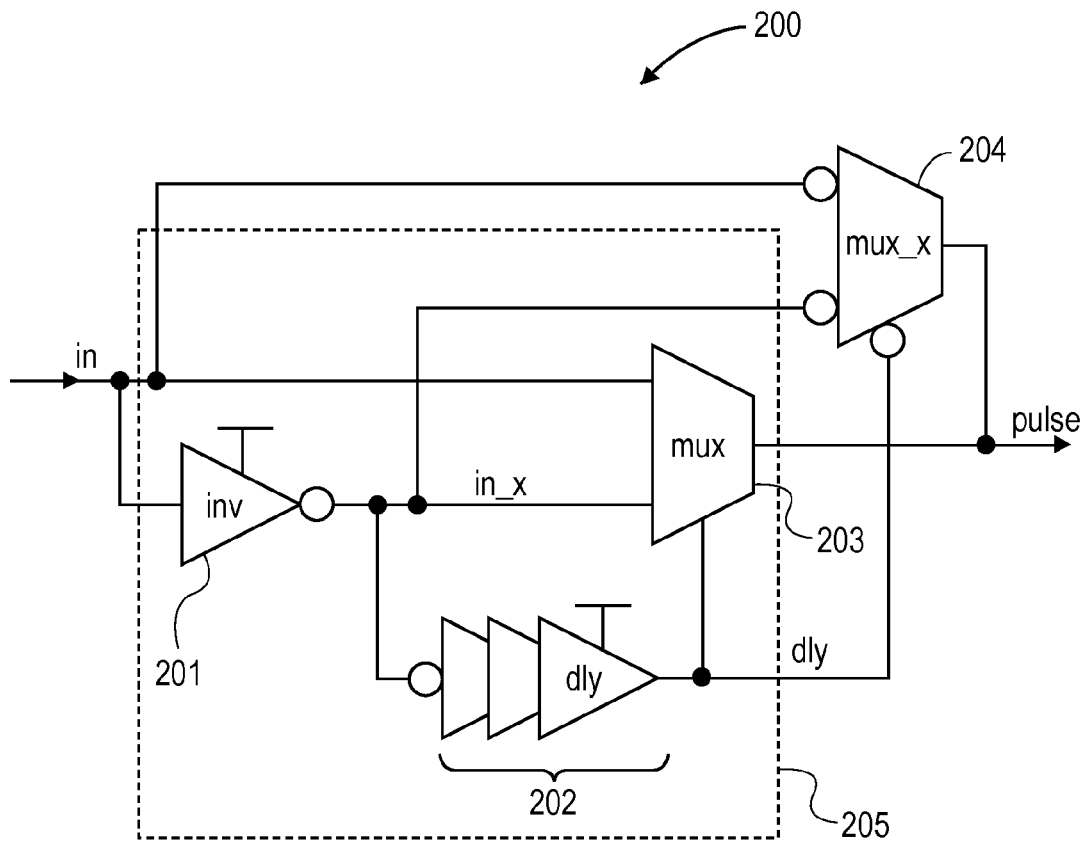
FIG. 2A illustrates an edge detector for generating transition edges, according to one embodiment of the invention.

FIG. 2A illustrates a high level schematic of the edge detector 200, according to one embodiment of the invention. The edge detector 200 comprises a pulse generator 205 coupled with a multiplexer 204 to generate variation immune transition edge based pulses from the input signal. In one embodiment, the pulse generator 205 has matched delays from the falling and rising edges of the input to the rising edge of the output pulse. The pulse generator 205, in one embodiment, is implemented via combinational logic such as transmission gates, inverters, and buffers. The combinational nature of the pulse generator allows for more flexible means for generating variation resistant matched output edges as compared to the level shifter 104. One reason for such flexibility is that the level shifter 104 has a complicated design caused by its cross coupled transistors, as shown in FIG. 3A, when compared to simple and easily characterizable combinational logic of the edge detector 200.

Referring back to FIG. 2A, the edge detector 200 is capable of operating at a lower power supply level Vcc1. One reason for the ability of operating at lower power supply levels is the addition of the multiplexer 204 which compensates for any variation in the output edges (pulses) caused by the pulse generator 205. The multiplexer 204, in one embodiment, is an active low multiplexer. In one embodiment, the multiplexer 204 provides a parallel path to the pulse generator 205 such that the output of the multiplexer 204 and the pulse generator 205 merge together to form the final output of the edge detector 200. This additional parallel path reduces the effect of variation in two possible ways.

First, the additional parallel path creates a redundant logic path. Generally, worst case process variation, which is defined as variation in Le (effective channel length) and Vt (threshold) of the devices, occurs at low voltage causing the devices to become weak due to magnified impact of process variations. The additional parallel path from the multiplexer 204 divides the worst case variation across devices in both paths i.e. the additional path and the path via the pulse generator 205.

Second, the additional parallel path decouples the nominal delay from the sizing of the multiplexer 203 in the pulse generator 205. In other words, without the additional multiplexer 204 other devices in the pulse generator including the multiplexer 203 would have to be of a large size to reduce the impact of variation on the output signal pulse. The addition of multiplexer 204 adds little to the area of the edge detector as compared to the reduction in size of the multiplexer 203 of the pulse generator 205. Consequently, the overall area of the edge detector 200 is reduced to achieve variation immune circuit topology when compared with the same goal of variation immunity via multiplexer 203 in the pulse generator 205 only.

As mentioned above, the additional multiplexer 204, in one embodiment, is an active low multiplexer. Such an active low multiplexer removes an inverter from the additional path in the edge detector and thus impacting equally both the rising and the falling edges of the output signal pulse. Without the active low multiplexer 204 that accepts active low inputs, traditionally an inverter (not shown) lies in the critical path for the falling edge but not the rising edge of the output signal of the edge detector. In such a case, the extra delay path caused by the inverter requires skewed sizing of devices in the pulse generator 205 to achieve matched delays. Skewed sizing unfavorably impacts variations in the overall circuit topology. Therefore, the active low multiplexer 204 removes the need for an additional inverter and also improves variation immunity because skewed sizing of devices is not required for achieving a matched delay path between the two parallel paths resulting in the output signal pulse. The active low multiplexer 204 receives both the input and the inverted input from 201.

The size of the output pulse of the edge detector 200, in one embodiment, is determined by the delay chain 202 which receives an inverted input in_x from the inverter 201. The output of the delay chain 202, in one embodiment, selects the multiplexer inputs for multiplexers 203 and 204. The delay chain 202, in one embodiment is a chain of inverters or buffers. Other embodiments may have different implementations of the delay chain 202 such as delay locked loop delay line.

The edge detector 200, in one embodiment, generates both the rising and the falling edge pulses, also known as transition edge based pulses, via only the input signal 'in.'

Figure 2B:
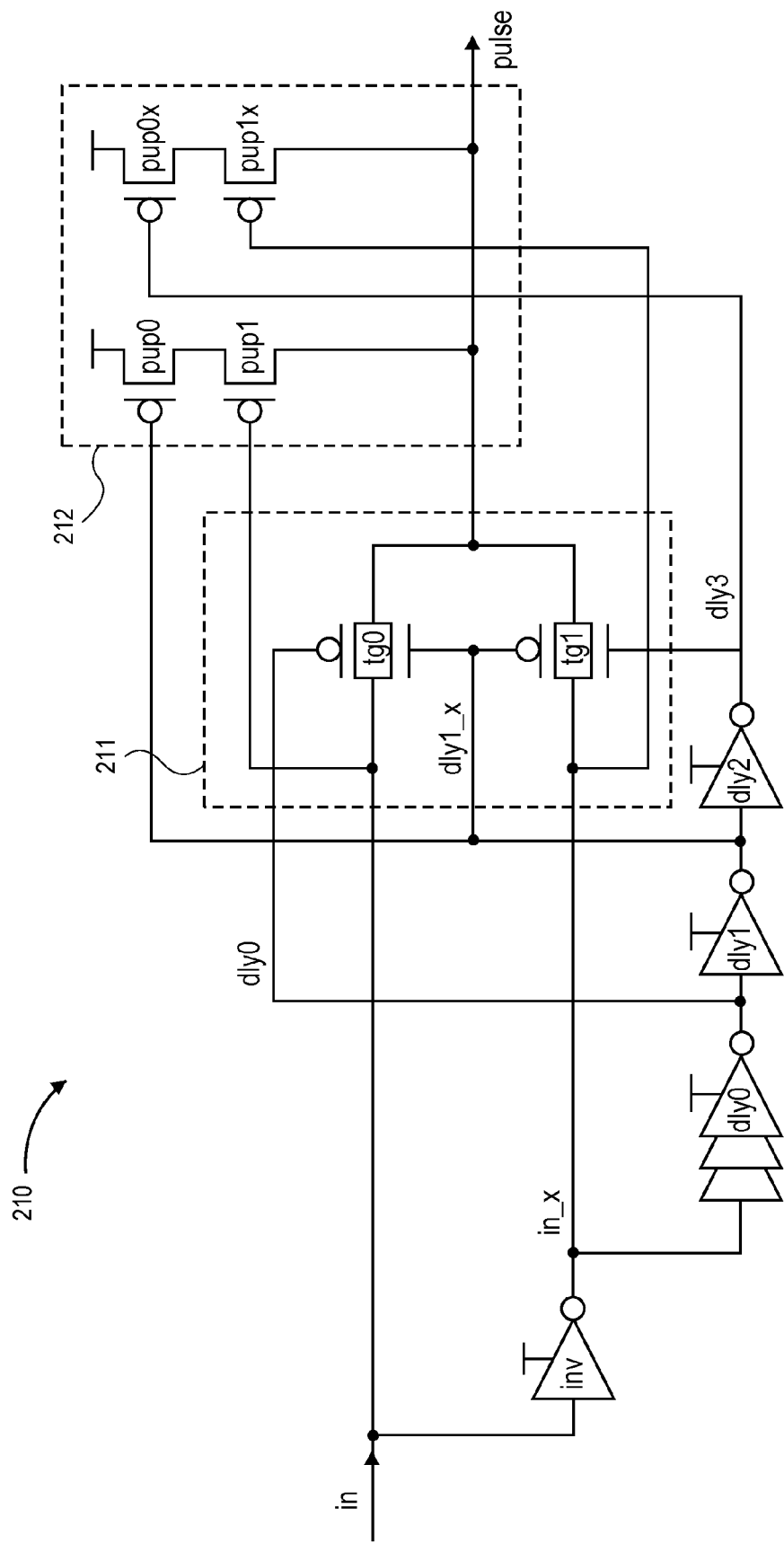
FIG. 2B illustrates a circuit implementation of the edge detector, according to one embodiment of the invention.

FIG. 2B shows a detailed implementation of the edge detector 210, according to one embodiment. Multiplexers 203 and 204 from FIG. 2A (which are shown as blocks 211 and 212 in FIG. 2B) are implemented, in one embodiment, as transmission gates tg0 and tg1 and pull-up devices pup0, pup1, pup0x, and pup1x respectively. The multiplexers are not limited to the above implementation. For example, in other embodiments, both multiplexers may be implemented as transmission gates and/or pull-up devices. In yet other embodiments, the multiplexers may be implemented as tri-state inverters.

While the rising edge pulses of the transition edge based pulses (from the input signal 'in') are generated via the transmission gates of multiplexer 211, the falling edge pulses of the transition edge based pulses (from the input signal 'in') are generated by the PMOS pull-up devices pup0, pup1, pup0x, and pup1x. These pull-up devices in 212, in one embodiment, invert the delayed input signal to form the output pulse. Since both edges of the input signal 'in' generate a rising output within a single gate delay, none of the device sizes of 200 need to be skewed (beyond the normal skew between a PMOS and an NMOS device based on mobility factors). In one embodiment, the single gate delay is generated by the pull-up PMOS device of the active-low multiplexer 212 that creates the falling edge pulse. In another embodiment, the single gate delay is generated by the pass-gate of the active-high multiplexer 211 that creates the rising edge pulse. The resulting design 100 is more immune to process variation.

In another embodiment, the transition edge based pulses can also be generated via both the transmission gates of the multiplexer 211 and the pull-up devices 212 as based on the inverted input signal 'in_x.' Such an embodiment limits the worst case edge skew to two gate delays, thus limiting the worst-case variation.

FIG. 3A illustrates a cascode voltage switch logic based level shifter (CVSL) 300 as implemented in the symmetrical level shifter according to one embodiment. In one embodiment, CVSL has a cross-coupled positive feedback. The input 'A' controls the gate of the NMOS transistor 301 and the PMOS 305 via the inverter 306, according to one embodiment of the invention. The inverter 306 operates on the first power supply level Vcc1. Input A operates between ground and Vcc1 while output B, from inverter 308, operates between ground and Vcc2. In one embodiment, Vcc2 is higher than Vcc1. In another embodiment, Vcc2 is lower than Vcc1. In one embodiment, Vcc1 and Vcc2 have a range of 0.45V to 1.5V. However, the voltage ranges are not limited to 0.45V and 1.5V. Other voltage ranges may work just as well.

In the CVLS 300, there is a contention between the pull-down devices, 301 and 307, and the cross-coupled devices (302, 303, 304, and 305) during any transition at input 'A.' Because the pull-up devices (303 and 304) operate on Vcc2 power supply level which, in one embodiment, is higher than Vcc1, this contention limits the difference between Vcc1 and Vcc2 and sets a minimum input supply voltage. This minimum input voltage, in one embodiment, is reduced by increasing the width of the pull-down devices (301 and 307) relative to that of the pull-up devices (303 and 304). The increase in width of the pull-down devices (301 and 307) is balanced with the area constraints on the CVLS design. The drive strength of the devices 302 and 303 control the speed of the falling output transitions because the output is tapped from node D#. Devices 302 and 305, in one embodiment, provide an interrupt path (a semi-interrupt path) to the pull-up devices 303 and 304. In one embodiment, the semi-interrupt path is provided because the input voltage is not high enough to fully turn the devices 302 and 305 off. This means that devices 302 and 305, in one embodiment, create a higher resistance path (higher than completely on devices) and so will aid the contention as the pull-down devices (301 and 307) are activated.

However, when the CVSL 300 follows the edge detector 102 (as shown in FIG. 1), the strength of the pull-up devices (303 and 304) is no longer directly related to the speed of either the rising edge or falling edge, according to one embodiment of the invention. This means that the sizes of the pull-up devices of the level-shifter, in one embodiment, can be reduced by half from a typical CVLS to achieve lower minimum input voltage, Vcc1, without adversely effecting output delays. In one embodiment, Vcc1 is lowered to 0.45V from 0.9V via the symmetrical switching level shifter 100 of FIG. 1.

FIG. 3B illustrates by waveforms 310 the operation of the symmetrical level shifter 100, according to one embodiment of the invention. The waveforms represent internal and external nodes of the symmetrical level shifter 100 as referred in FIG. 1 and FIG. 2A. The edge detector 102 receives input 101 as shown by signal 311 in FIG. 3B. This signal operates on the first power supply level Vcc1. The output of the edge detector is transition based edge pulses 312 operating on the first power supply level Vcc1. For every rising and falling edge of the input 311, a pulse is formed with a width that depends on the delay of the delay chain 202 shown in FIG. 2A. The level shifter 104 receives the input 'A' 312 and level shifts it to the second supply level Vcc2.

Because the edge detector 102 generates transition edge based pulses 312 from the input signal 311, which is not fed directly to the level shifter 104, only one output edge of the of the transition based pulse propagates through the level shifter 104. This means that changes in device strengths within the level shifter 104 cannot have any impact in signal edge skew (for example, edge skew for a clock as an input signal) because changes in device strength within the level shifter 104 will affect both edges of the input signal. Such architecture removes, in one embodiment, all sensitivity to process variation away from the level shifter 104 to the edge detector 102. As discussed above, the edge detector 102 resolves the process variation by the additional multiplexer 204 as shown in FIG. 2A.

The output of the level shifter 104 shown by signal 313, in one embodiment, operates on the second power supply level Vcc2. Signal 313, in one embodiment, is generated when the rising edge of the transition edge based pulse at input 312 propagates through two gate delays. In one embodiment, the two gate delays comprise the pull-down device 301 and the inverter 308. In other embodiments, fewer or more gate delays are in the propagation path from input A to output B. The degraded falling edge output from the level shifter 104 does not affect the final output of the symmetrical level shifter 100 because the toggle flip-flop 106 divides down the signal 313 using its rising edge to form signal 314.

Referring back to FIG. 3B, signals 315, 316, and 317 refer to internal signals of the edge detector 200 of FIG. 2A. The input signal 315 (which is the same input as 311) is delayed by the delay chain 202 to form signal 316. In one embodiment, the delay comprises of four inverter delays. In other embodiments fewer or more gate delays may be implemented. The width of the output pulse 317, in one embodiment, depends on the number of gate delays in the delay chain 202. Each rising edge of the transition edge based pulse 317, in one embodiment, is generated by a single gate delay.

FIG. 4A is a high level circuit illustrating a toggle flip-flop 400 according to one embodiment of the invention. The function of the toggle flip-flop 400, in one embodiment, is to receive input 'B' as a clock signal and to divide that signal down by two. The toggle flip-flop 400, in one embodiment, is resettable flip-flop. The RESET input to the toggle flip-flop 400, in one embodiment, forces an initial state of the flip-flop 401 so that the start-up state is in phase with the input signal.

Any standard flip-flop 401 may be used for implementing the toggle flip-flop 400. In one embodiment, a D-Q flip-flop may be used to implement the flip-flop 401. The toggle flip-flop 400, in one embodiment, operates on the second power supply level Vcc2. When the input 'B,' which connects to the clock input of the flip-flop 401, transitions from low-to-high (for example, ground to Vcc2), and if the current output state is at ground, the output OUT transitions from low-to-high (for example, ground to Vcc2). When the input 'B' remains at a steady state value of Vcc2 or ground, or transitions from high-to-low (Vcc2 to ground), the output OUT remains stable. The inverted version of OUT, OUT#, is fed back into the data input of the flip-flop 401 to form a toggle flip-flop. FIG. 4B illustrates another embodiment of the toggle flip-flop 410. An inverter 412 inverts the output OUT and feeds its output to the data input of the flip-flop 411. The overall operation of the toggle flip-flop 410 is similar as the toggle flip-flop 400 of FIG. 4A. In one embodiment, the toggle flip-flops 400 and 410 are configured to accept high-to-low input transitions as well. In such an embodiment, the edge detector 102 and the level shifter 104 from FIG. 1 incorporate a falling edge detection scheme.

FIG. 5 illustrates a graphical representation 500 of performance improvement via the symmetrical level shifter over the transitional level shifter. The x-axis is the input power supply level Vcc1. The left y-axis represents edge skew in picoseconds (ps) as measured by change in input signal relative to the output signal. The right y-axis represents number of delay stages in a normalized form. The purpose of representing the delay stages in a normalized form is that the absolute delay does not matter as much as the delay relative to a normal device at the same temperature, voltage, and process skew corner.

Although the edge skew of a level shifter, in one embodiment, may increase as the input voltage decreases, the delay across a typical gate will also increase as Vcc1 is lowered. Therefore, FIG. 5 represents the edge skew as normalized to a number of stages of delay of an inverter at the same temperature, voltage, and process skew corner. The diamond graph 503 represents a traditional level shifter skew at the worst case scenario, while the triangle graph 501 represents the edge skew from the symmetrical level shifter according to one embodiment of the invention. Worst case scenario is defined as the process, voltage, and temperature corner that generates the worst edge skew for the level shifter.

In the illustrative graph of FIG. 5, the traditional level shifter shows a worst case performance (in view of edge skew) at a realistic fast process corner, 0 deg Celsius, and 5.5 sigma of random and systematic variation in Le and Vt of the level shifter devices.

The symmetrical level shifter, in one embodiment, allows for a much lower first power supply level of Vcc1 when compared to a traditional level shifter for a given edge skew. For example, in one embodiment, Vcc1 can be lowered by 100 mV to 0.45V over a traditional level shifter whose Vcc1 can only be lowered to 0.55V before edge skew exponentially degrades.

The symmetrical level shifter, in one embodiment, also allows for faster delay while operating the level shifter at a much lower first power supply level of Vcc1 when compared to a traditional level shifter. For example, in one embodiment, the delay in terms of number of gate stages for a symmetrical level shifter is less than one gate stage for the first power supply level Vcc1 of 0.45V, as shown by the square graph 502. Such low power supply level for Vcc1 is not achievable for a traditional level shifter unless the delay stages are increased many folds, as shown by the circle graph 504. Conversely, for the same delay of one gate stage comparison, 502 shows that the symmetrical level shifter at 0.45V allows for 100 mV lower Vcc-min (Vcc1 or Vcc2) as compared to the traditional level shifter operating at 0.55V as shown with 504.

Figure 6:
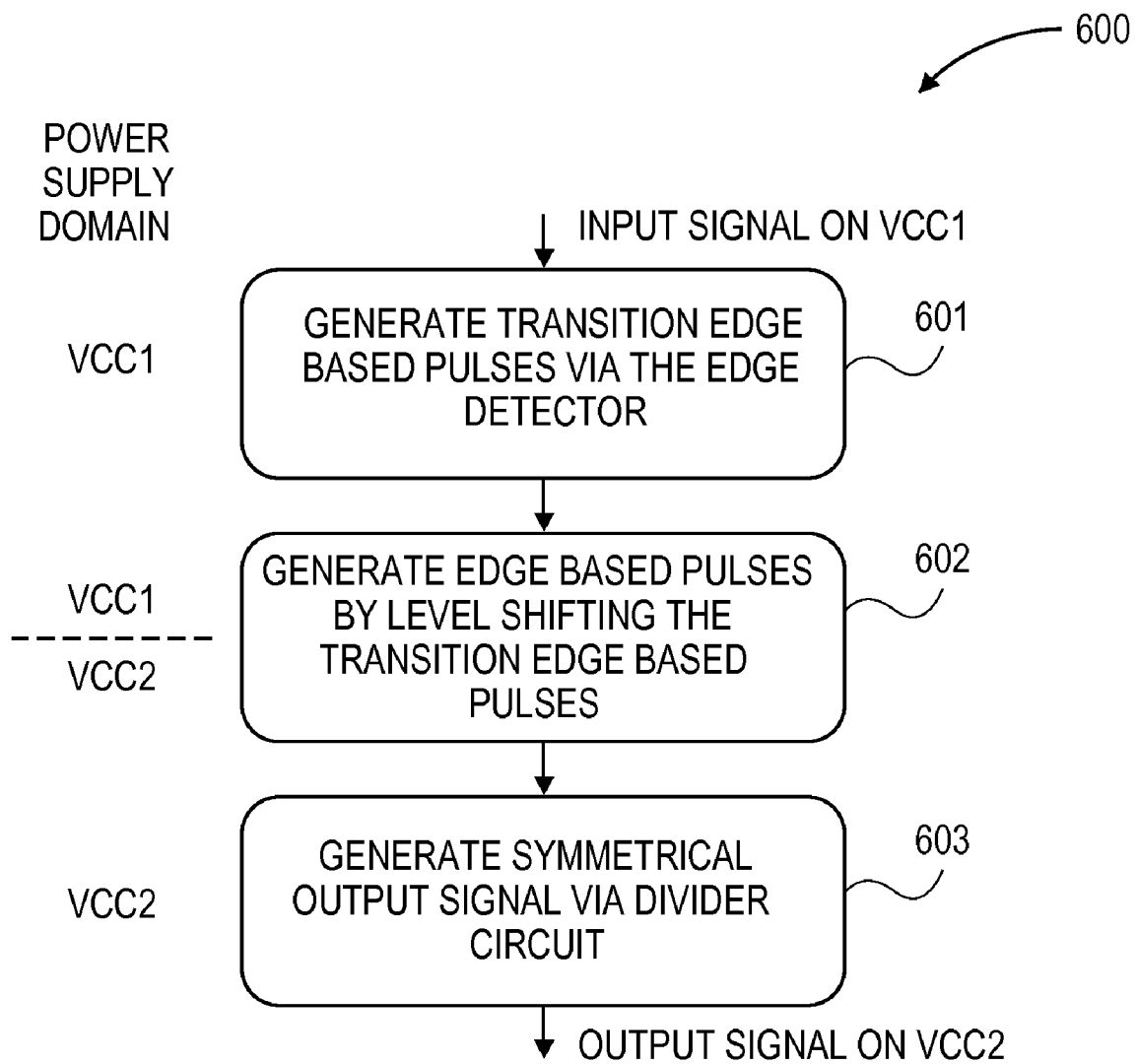
FIG. 6 illustrates a flow chart showing the process of generating a symmetrical output signal via the symmetrical switching level shifter, according to one embodiment of the invention.

FIG. 6 illustrates a flow chart 600 of the high level operation of the symmetrical level shifter, according to one embodiment of the invention. At block 601, input signal at first power supply level of Vcc1 is received by the edge detector 102. The edge detector generates transition edge based pulses which are process variation immune. At block 602, the level shifter 104 receives the transition edge based pulses and level shifts them from Vcc1 to Vcc2 power supply levels. At block 603, output signal via the divider circuit is generated. This output signal has a frequency which is half the frequency of the input signal to the divider circuit.

While the invention has been described in conjunction with specific embodiments thereof, many alternatives, modifications and variations will be apparent to those of ordinary skill in the art in light of the foregoing description.

For example, the level shifter 104 as described by FIG. 3A can be replaced by any known voltage level shifter that converts a signal operating on a first power supply level Vcc1 to another power supply level Vcc2. Similarly, the design of the symmetrical level shifter which is described in terms of rising edges of the transition edge based pulses, in one embodiment, can be implemented using falling edges of the input signal 101. Such embodiment may require that the edge detector generate transition edge based pulses from the falling edges of the input signal 101.

Embodiments of the invention are intended to embrace all such alternatives, modifications, and variations as to fall within the broad scope of the appended claims.

We claim:

1. An apparatus comprising:
an edge detector operable to generate transition edge based pulses from an input signal based on a first power supply level;
a voltage level shifter, coupled with the edge detector, operable to convert the transition edge based pulses based on the first power supply level to edge based pulses based on a second power supply level; and
a divider circuit, coupled with the voltage level shifter, operable to generate an output signal from the edge based pulses based on the second power supply level.

2. The apparatus of claim 1, wherein the edge detector further comprises:
a pulse generator to generate first transition edge based pulses based on the first power supply level; and
a first multiplexer coupled with the pulse generator, the first multiplexer to compensate for variations in the first transition edge based pulses by merging its output with the first transition edge based pulses, the merging to generate the transition edge based pulses based on the first power supply level.

3. The apparatus of claim 2, wherein the first multiplexer is an active low multiplexer.

4. The apparatus of claim 2, wherein the pulse generator comprises:
a delay chain; and
a second multiplexer coupled with the delay chain and the first multiplexer, the delay chain to control the second multiplexer.

5. The apparatus of claim 2, wherein the first multiplexer is operable to provide a parallel signal path for the input signal, the parallel signal path is parallel to a signal path of the pulse generator.

6. The apparatus of claim 1, wherein the voltage level shifter comprises:
a switch to receive the transition edge based pulses based on the first power supply level; and
a driver coupled with the switch, the driver to generate the edge based pulses based on the second power supply level from the transition edge based pulses based on the first power supply level.

7. The apparatus of claim 1, wherein the divider circuit comprises:
a toggle flip-flop to receive the edge based pulses based on the second power supply level, and to generate the output signal based on the second power supply level.

8. The apparatus of claim 7, wherein the toggle flip-flop is resettable to align phases of the edge based pulses based on the second power supply level and the output signal.

9. The apparatus of claim 1, wherein the output signal based on the second power supply level has a frequency equal to the frequency of the input signal.

10. The apparatus of claim 1, wherein the edge detector is operable to generate the transition edge based pulses from both a rising edge and a falling edge of the input signal, and wherein the transition edge based pulses have a frequency which is twice the frequency of the input signal.

11. A method comprising:
generating transition edge based pulses, by an edge detector, from an input signal based on a first power supply level;
generating edge based pulses based on a second power supply level by level shifting the transition edge based pulses based on the first power supply level; and
dividing frequency of the edge based pulses based on the second power supply level to generate an output signal based on the second power supply level.

12. The method of claim 11, wherein generating the transition edge based pulses comprises:
generating, by a pulse generator, first transition edge based pulses based on the first power supply level;
transmitting the input signal via a parallel logic path, the parallel logic path is parallel to a signal path of the pulse generator; and
merging the transmitted input signal with the first transition edge based pulses to generate the transition edge based pulses.

13. The method of claim 11, wherein the transition edge based pulses have a frequency which is twice the frequency of the input signal.

14. The method of claim 12, wherein the level shifting comprises:
receiving the transition edge based pulses based on the first power supply level; and
generating the edge based pulses based on the second power supply level via only one of the edges of the transition edge based pulses.

15. The method of claim 14, wherein the only one of the edges of the transition edge based pulses is a rising edge.

16. The method of claim 14, wherein the only one of the edges of the transition edge based pulses is a falling edge.

17. The method of claim 11, wherein dividing the frequency of the edge based pulses to generate the output signal is performed by a toggle flip-flop operable at the second power supply level, and wherein the output signal has a frequency equal to the frequency of the input signal.

18. An apparatus comprising:
means for generating transition edge based pulses from an input signal based on a first power supply level;
means for generating edge based pulses based on a second power supply level by level shifting the transition edge based pulses based on the first power supply level; and
means for dividing frequency of the edge based pulses based on the second power supply level to generate an output signal.

19. The apparatus of claim 18, wherein the means for generating the transition edge based pulses comprises:
means for generating first transition edge based pulses from the input signal; and
means for merging the input signal with the generated first transition edge based pulses.

20. The apparatus of claim 18, wherein the means for generating the edge based pulses comprises:
means for receiving the transition edge based pulses based on the first power supply level; and
means for generating the edge based pulses based on the second power supply level via only one of the edges of the transition edge based pulses.

\* \* \* \* \*